US009135846B2

(12) United States Patent
Huang et al.

(10) Patent No.: US 9,135,846 B2
(45) Date of Patent: Sep. 15, 2015

(54) METHOD FOR DETECTING LIQUID CRYSTAL DISPLAY PANEL AND DETECTING SYSTEM

(75) Inventors: Hao Huang, Guandong (CN); Chun Liu, Guandong (CN); Chang-hung Pan, Guandong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 308 days.

(21) Appl. No.: 13/521,686

(22) PCT Filed: Jun. 13, 2012

(86) PCT No.: PCT/CN2012/076811

§ 371 (c)(1), (2), (4) Date: Jul. 11, 2012

(87) PCT Pub. No.: WO2013/177830

PCT Pub. Date: May 12, 2013

(65) Prior Publication Data

US 2013/0321020 A1 Dec. 5, 2013

(30) Foreign Application Priority Data

May 30, 2012 (CN) .......................... 2012 1 0174052

(51) Int. Cl.
*G01R 31/26* (2014.01)
*G09G 3/00* (2006.01)

(52) U.S. Cl.
CPC ............ *G09G 3/006* (2013.01); *G09G 2330/12* (2013.01)

(58) Field of Classification Search
CPC ............................... G02F 1/133; G02F 1/1345
USPC ..................................................... 324/760.01
See application file for complete search history.

(56) References Cited

U.S. PATENT DOCUMENTS

| | | | | |
|---|---|---|---|---|
| 2007/0195255 A1* | 8/2007 | Cho et al. | ...................... | 349/153 |
| 2009/0284706 A1* | 11/2009 | Liu et al. | ...................... | 349/150 |
| 2010/0219853 A1* | 9/2010 | Cho et al. | ...................... | 324/754 |

* cited by examiner

*Primary Examiner* — Tung X Nguyen

(74) *Attorney, Agent, or Firm* — Andrew C. Cheng

(57) ABSTRACT

The present provide a technical solution by introducing a method of detecting a liquid crystal display panel, characterized in that the method includes a) providing an all-connection lit-up fixture having a plurality of probes. And b) performing a lit-up test by establishing an electrical coupling between the probes and a plurality of contacts on the liquid crystal display panel. By this arrangement, the liquid crystal display panel can be readily pin-pointed the defects after the shorting bar is cut off as the fixture provided can readily restore the lit-up test Accordingly, the capability of lit-up test is therefore enhanced.

9 Claims, 2 Drawing Sheets

METHOD FOR DETECTING LIQUID CRYSTAL DISPLAY PANEL AND DETECTING SYSTEM

FIELD OF THE INVENTION

Figure 1:
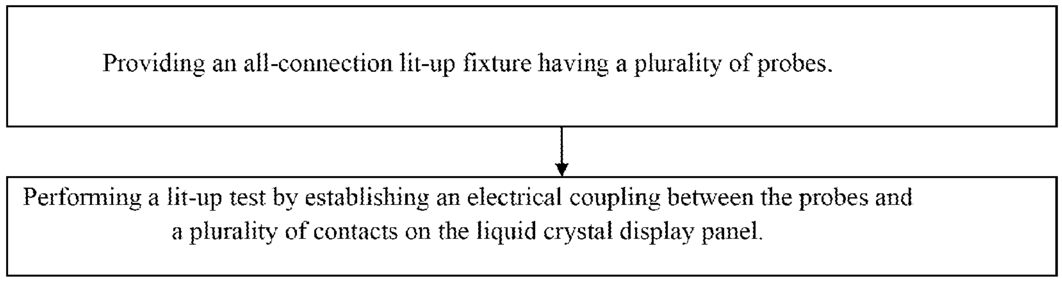

The present invention relates to a method for detecting a liquid crystal display device and also a detecting system. The liquid crystal display panel can be restored to perform a "lit up test" after the shorting bar of the liquid crystal display panel is cut off.

DESCRIPTION OF PRIOR ART

With advancement of technology, the liquid crystal display (LCD) device featured with low radiation, compact, slim and low energy exhaustion has been widely used in mobile phone, personal digital assistant, notebook computer, personal computer and television. Conventional cathode ray tube (CRT) has been gradually replaced by the liquid crystal display.

The liquid crystal display panel is the most important part of a liquid crystal display device, and it generally includes a Thin Film Transistor (TFT) substrate, a color filter substrate, and a liquid crystal filled between those two substrates. On the other hand, there are a lot of other components on the TFT substrate, such as a plurality of scanning lines, a plurality of data lines, a plurality of pixels and other electronic components disposed on the TFT substrate in array. In order to make sure all the electronic components on the TFT substrate correctly interconnected, a so-called shorting bar is coupled to an edge of the TFT substrate during the manufacturing process. The shorting bar can be used to perform a "lit-up test" during the "cell" manufacturing process before the final modulation of the liquid crystal display device. After the test is completed, then the shorting bar will be cut off, and the liquid crystal display panel will be sent to next station for modulation.

However, if the liquid crystal display panel is found with some defects after the modulation, while the shorting bar has been cut off, it is unlikely to use the shorting bar to perform a "lit-up test" during the cell stage. As a result, the technician has no way to determine whether this defect was resulted from 1) the technician forgot to perform the "lit-up" test; and 2) this is a defect that the "lit-up" test can not detect.

SUMMARY OF THE INVENTION

In order to resolve the prior issue, the present invention provides a method for detecting the liquid crystal display panel, and also discloses a detecting system such that after the shorting bar is cut off, the "lit-up" test can be still performed.

The present provide a technical solution by introducing a method of detecting a liquid crystal display panel, characterized in that the method includes a) providing an all-connection lit-up fixture having a plurality of probes. And b) performing a lit-up test by establishing an electrical coupling between the probes and a plurality of contacts on the liquid crystal display panel.

Wherein the all-connection lit-up fixture is further connected to a printed circuit board on which a plurality of indicators are mounted so as to perform the "lit-up" test.

Wherein the all-connection fixture is connected to the printed circuit board by means of a chip-on-film substrate so as to perform the lit-up test.

Wherein the liquid crystal display panel is interconnected to a driving IC substrate of the liquid crystal display panel by those contacts.

Wherein the driving IC substrate includes a source driver located on X-axis, and a gate driver located on Y-axis:

The present invention further provides a technician solution by introducing a detecting system, characterized in that the system includes an all-connection lit-up fixture having a plurality of probes for contacting contacts on the liquid crystal display panel. And a printed circuit board connected to the all-connection lit-up fixture so as to provide indicating signals and sending the indicating signals to the liquid crystal display panel.

Wherein the system further comprises a chip on film (COF) substrate disposed between the all-connection lit-up fixture and the printed circuit board.

Wherein the system further comprises a chip on film (COF) substrate disposed between the all-connection lit-up fixture and the printed circuit board.

Wherein the driving IC substrate includes a source driver located on X-axis, and a gate driver located on Y-axis.

The present invention can be concluded with the following advantages as compared to the existing prior arts. By the provision of the technology of method and system introduced by the present invention, the fixture can perform a lit-up test even after the shorting bar was cut off from the liquid crystal display panel. This is extremely advantageous to the technician as the defects found after modulation of the liquid crystal display panel can be readily pin-pointed as whether it was an inherited, i.e. the technician forgot to perform a lit-up test during the previous stage, or it was a defect during the modulation stage. Accordingly, a measurement can be readily given so as to resolve the defects while enhancing the quality control capability.

DETAILED DESCRIPTION OF PREFERRED EMBODIMENT

Detailed description will be given along with the accompanied drawings.

FIG. 1 is an illustrational flow diagram of a method for detecting a liquid crystal display device and also a detecting system. Referring to FIG. 1, the method for detecting a liquid crystal display device includes the steps of the following:

Providing an all-connection lit-up fixture having a plurality of probes; and b) performing a lit-up test by establishing an electrical coupling between the probes and a plurality of contacts on the liquid crystal display panel.

Figure 2:
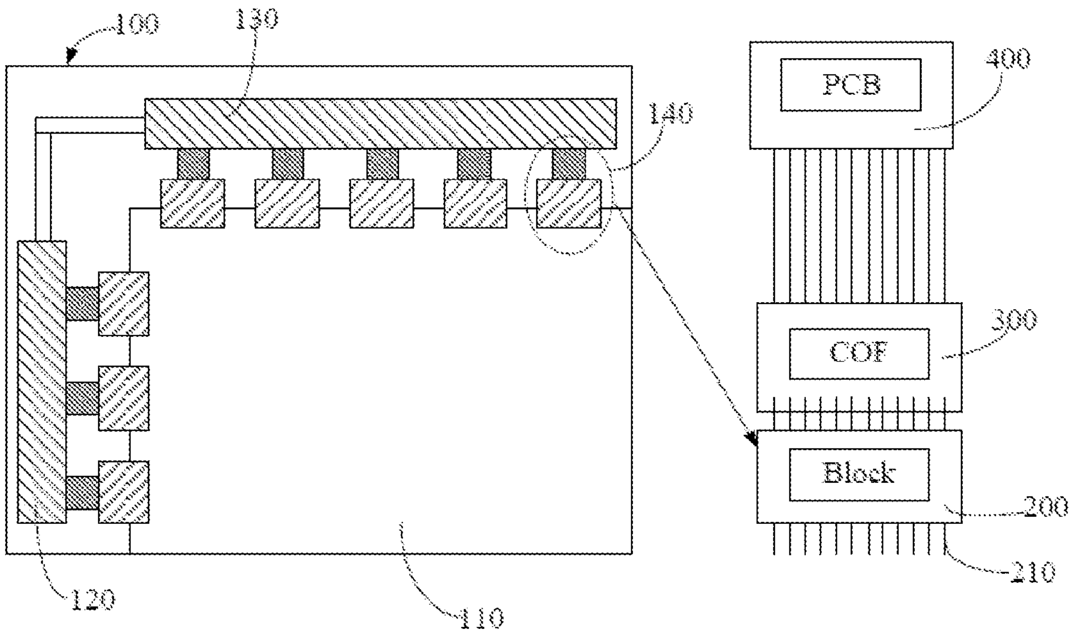

Substantially, FIG. 2 is a substantial configuration of a detecting system and apparatus performing the detecting method illustrated in FIG. 1. As shown in FIG. 2, a liquid crystal display panel 100 includes a displaying area 110, and a driving IC substrates 120, 130 located on the boarder area. The displaying area 110 includes a plurality of scanning lines (not shown), and a plurality of data lines (not labeled). These scanning lines and data lines jointly weave an array of pixels across the displaying area 110 of the liquid crystal display panel 100. Each of the pixels includes a switch constructed by a thin-film transistor (not shown in this Figure), and a pixel electrode (not shown). These electronic components located within the displaying area 110 can be interconnected to the driving IC substrates 120 and 130 by electrical contacts 140 such that the liquid crystal display panel 100 can work and function properly as it should.

Wherein the driving IC substrates 120 and 130 includes a gate driving IC driving substrate 120 located on the Y-axis, and a source driving substrate 130 located on the X-axis. The gate driving IC substrate 120 is electrically interconnected to the gate lines located within the displaying area 110 so as to control each of the switches, i.e. the thin-film transistor, on or off by the electrical contacts 140. While the source driving IC substrate 130 is electrically to the data lines located within the displaying area 110 by the electrical contacts 140 so as to transfer signals of pattern to the pixel electrode. As a result, the pixel electrodes across the liquid crystal display panel 100 will display the pattern. In addition, the gate driving IC substrate 120, and the source driving IC substrate 130 can be embodied as a chip-on-film (COF), or tape carrier package (TCP) so as to conveniently attach to the liquid crystal display panel 100.

It could be readily understood by the skilled in the art that the liquid crystal display panel 100 shown in FIG. 2 has been modulated, i.e. a shorting bar connected thereto for lit-up test has been cut off during the so called Cell stage.

When performing the detecting method introduced by the present invention, an all-connection lit-up fixture 200, as disclosed in FIG. 2, can be used so as to interconnect with the electrical contacts 140 of the liquid crystal display panel 100. The all-connection lit-up fixture 200 has a plurality of probes 210 and the number of the probes can be as many as the number of the shorting bar. Accordingly, the function of the shorting bar is revived and restored by the provision of the fixture 200.

Substantially, the plurality of probes 210 of the all-connection lit-up fixture 200 can be arranged to in touch of the electrical contacts 140 of the liquid crystal display panel 100 at one ends, while the other ends are electrically interconnected to the COF substrate 300. The COF substrate 300 is then interconnected to the printed circuit board 400. Accordingly, the indicating or testing signals provided by the printed circuit board 400 can be transferred to the all-connection lit-up fixture 200. Then the indicating signals can be transferred to the liquid crystal display panel 100 by means of the all-connection lit-up fixture 200.

By the provision of the technology of method and system introduced by the present invention, the fixture 200 can perform a lit-up test even after the shorting bar was cut off from the liquid crystal display panel 100. This is extremely advantageous to the technician as the defects found after modulation of the liquid crystal display panel 100 can be readily pin-pointed as whether it was an inherited, i.e. the technician forgot to perform a lit-up test during the previous stage, or it was a defect during the modulation stage. Accordingly, a measurement can be readily given so as to resolve the defects while enhancing the quality control capability.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

The invention claimed is:

1. A method for detecting a liquid crystal display panel that comprises a number of shorting bars that have been cut off, characterized in that the method includes:

a) providing lit-up fixture having a plurality of probes that corresponds in number to the shorting bars; and b) performing a lit-up test by establishing an electrical coupling between the probes and a plurality of contacts on the liquid crystal display panel;

wherein the lit-up fixture enables revival and restoration of the function of shorting bar.

2. The method as recited in claim 1, characterized in that the lit-up fixture is further connected to a printed circuit board on which a plurality of indicators are mounted so as to perform the "lit-up" test.

3. The method as recited in claim 2, characterized in that the fixture is connected to the printed circuit board by means of a chip-on-film substrate so as to perform the lit-up test.

4. The method as recited in claim 1, characterized in that the liquid crystal display panel is interconnected to a driving IC substrate of the liquid crystal display panel by those contacts.

5. The method as recited in claim 4, characterized in that the driving IC substrate includes a source driver located on X-axis, and a gate driver located on Y-axis.

6. A liquid crystal display panel detecting system, characterized in that the system includes:

a lit-up fixture having a plurality of probes for contacting contacts on the liquid crystal display panel that comprises a number of shorting bars that have been cut off, wherein the probes correspond in number to the shorting bars so as to enable revival and restoration of the function of shorting bars; and a printed circuit board connected to the lit-up fixture so as to provide indicating signals and sending the indicating signals to the liquid crystal display panel.

7. The detecting system as recited in claim 6, characterized in that the system further comprises a chip on film (COF) substrate disposed between the all-connection lit-up fixture and the printed circuit board.

8. The detecting system as recited in claim 6, characterized in that the liquid crystal display panel interconnects to the driving IC substrate through the contacts.

9. The detecting system as recited in claim 6, characterized in that the driving IC substrate includes a source driver located on X-axis, and a gate driver located on Y-axis.

* * * * *